United States Patent
Wu

(10) Patent No.: US 9,401,733 B2
(45) Date of Patent: Jul. 26, 2016

(54) ELECTRONIC DEVICE ENCLOSURE

(71) Applicant: DINKLE ENTERPRISE CO., LTD., New Taipei (TW)

(72) Inventor: Shang Tsai Wu, New Taipei (TW)

(73) Assignee: DINKLE ENTERPRISE CO., LTD., New Taipei (TW)

( * ) Notice: Subject to any disclaimer, the term of this patent is extended or adjusted under 35 U.S.C. 154(b) by 7 days.

(21) Appl. No.: 14/339,718

(22) Filed: Jul. 24, 2014

(65) Prior Publication Data
US 2016/0029501 A1 Jan. 28, 2016

(51) Int. Cl.
*H05K 5/02* (2006.01)
*H04B 1/38* (2015.01)
*H04B 1/3888* (2015.01)

(52) U.S. Cl.
CPC ............... *H04B 1/38* (2013.01); *H04B 1/3888* (2013.01); *H05K 5/0204* (2013.01)

(58) Field of Classification Search
CPC .................................................... H05K 5/0204
See application file for complete search history.

(56) References Cited

U.S. PATENT DOCUMENTS

| | | | | |
|---|---|---|---|---|
| 7,049,512 B1* | 5/2006 | Chung | ................. | H05K 5/0204 174/135 |
| 2002/0084729 A1* | 7/2002 | Nunokawa | ........... | H05K 5/0204 312/223.6 |
| 2003/0082955 A1* | 5/2003 | Zaderej et al. | ....... | H01R 13/514 439/701 |
| 2004/0013098 A1* | 1/2004 | Tseng et al. | ......... | H05K 5/0204 370/338 |
| 2004/0145867 A1* | 7/2004 | Tomino et al. | ..... | H05K 7/20009 361/690 |
| 2005/0288071 A1* | 12/2005 | Wu | ....................... | H05K 5/0204 455/575.1 |
| 2007/0018067 A1* | 1/2007 | Huang | ................. | H05K 5/0204 248/346.03 |
| 2007/0145230 A1* | 6/2007 | Van Den Bossche | ............... | H05K 5/0204 248/682 |
| 2007/0172254 A1* | 7/2007 | Li | ........................ | F16M 11/00 399/122 |
| 2008/0019096 A1* | 1/2008 | Nakajima | ............ | H05K 5/0008 361/704 |
| 2008/0105803 A1* | 5/2008 | Tu | ........................ | H05K 5/0204 248/220.22 |
| 2009/0230827 A1* | 9/2009 | Macall | ................. | H05K 5/0204 312/223.1 |
| 2010/0181836 A1* | 7/2010 | Yang | ....................... | H02J 9/061 307/66 |
| 2011/0146163 A1* | 6/2011 | Naroditsky | .......... | H05K 5/0204 52/27 |
| 2012/0019994 A1* | 1/2012 | Kuan | ................... | F16M 11/105 361/679.01 |
| 2012/0292096 A1* | 11/2012 | Wakileh et al. | ....... | G02B 6/4448 174/480 |
| 2013/0135842 A1* | 5/2013 | Kuan | ................... | H05K 5/0204 361/825 |
| 2015/0156903 A1* | 6/2015 | Heimerl | .............. | H05K 5/0204 174/520 |

* cited by examiner

*Primary Examiner* — Hung V Ngo
(74) *Attorney, Agent, or Firm* — Muncy, Geissler, Olds & Lowe, P.C.

(57) ABSTRACT

An electronic device enclosure which includes a front surface, a back surface opposite to the front surface, and a lateral edge connected with the front surface, wherein a part of the front surface is sloped towards the back surface to define a slope area that extends to the lateral edge, wherein the electronic device enclosure is provided with at least one attachment located in the slope area and at least one connecting port located away from the slope area, whereby the use of the enclosure can be effectively achieved.

6 Claims, 7 Drawing Sheets

ELECTRONIC DEVICE ENCLOSURE

BACKGROUND OF THE INVENTION

1. Technical Field

The present invention relates to an electronic device enclosure, and more particularly, to an electronic device enclosure which can improved using convenience.

2. Description of Related Art

General electronic device enclosures, e.g., a router, a TV box or the like, have circuit boards with different functions received therein depending on different using demands.

Moreover, the electronic device enclosures are provided with one or more connecting ports, e.g., network line connecting ports, video line connecting ports, audio line connecting ports, power line connecting ports or the like, which are used to be connected (plugged) to related circuit lines.

However, conventional electronic device enclosures are generally desired an manufactured with a boxy shape, and when the electronic device enclosures are installed on, for example, a wall, the connecting ports thereof usually will be close to the wall. In other words, when people try to connect (plug) the circuit lines to the connecting ports of the electronic device enclosure, the space where people can move freely is limited by the wall, so it is difficult to connect (plug) the circuit lines to the connecting ports of the electronic device enclosure, which results in great inconvenience for use.

BRIEF SUMMARY OF THE INVENTION

An electronic device enclosure of the present invention comprises a front surface, a back surface opposite to the front surface, and a lateral edge connected with the front surface, wherein a part of the front surface is sloped towards the back surface to define a slope area that extends to the lateral edge, and the electronic device enclosure is provided with at least one attachment located in the slope area and at least one connecting port located away from the slope area.

Accordingly, the objective of improving using convenience can be achieved via the aforesaid structural design.

In detail, after the aforesaid electronic device enclosure is installed on, for example, a wall, the electronic device enclosure is sloped from the wall with an angle via the structural design that the front surface thereof has a slope area. At this point, the connecting port located away from the slope area will be space apart from the wall for a distance, so people can connect (plug) the circuit lines to the connecting port in a relatively large space without the limitation of the wall and the using convenience can be improved remarkably.

The at least one attachment is a locking hole that extends through the front surface and the back surface.

The lateral edge is formed with a concave portion.

The electronic device enclosure has a circuit board received therein.

A connector is soldered to the circuit board and protrudes from the concave portion.

The electronic device enclosure is provided with at least one heat dissipating hole.

DETAILED DESCRIPTION OF THE INVENTION

Figure 1:
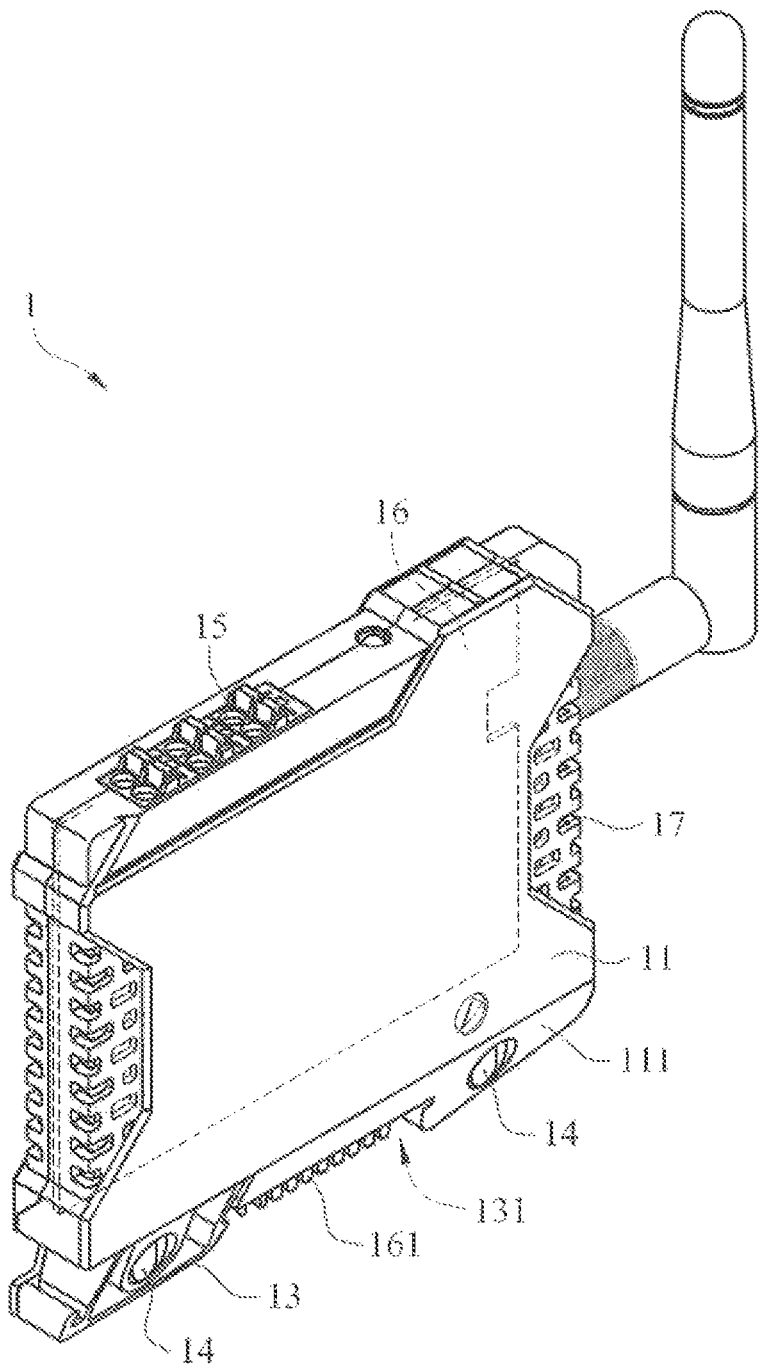
FIG. 1 is a perspective view of a first preferred specific embodiment of the present invention.
Figure 2:
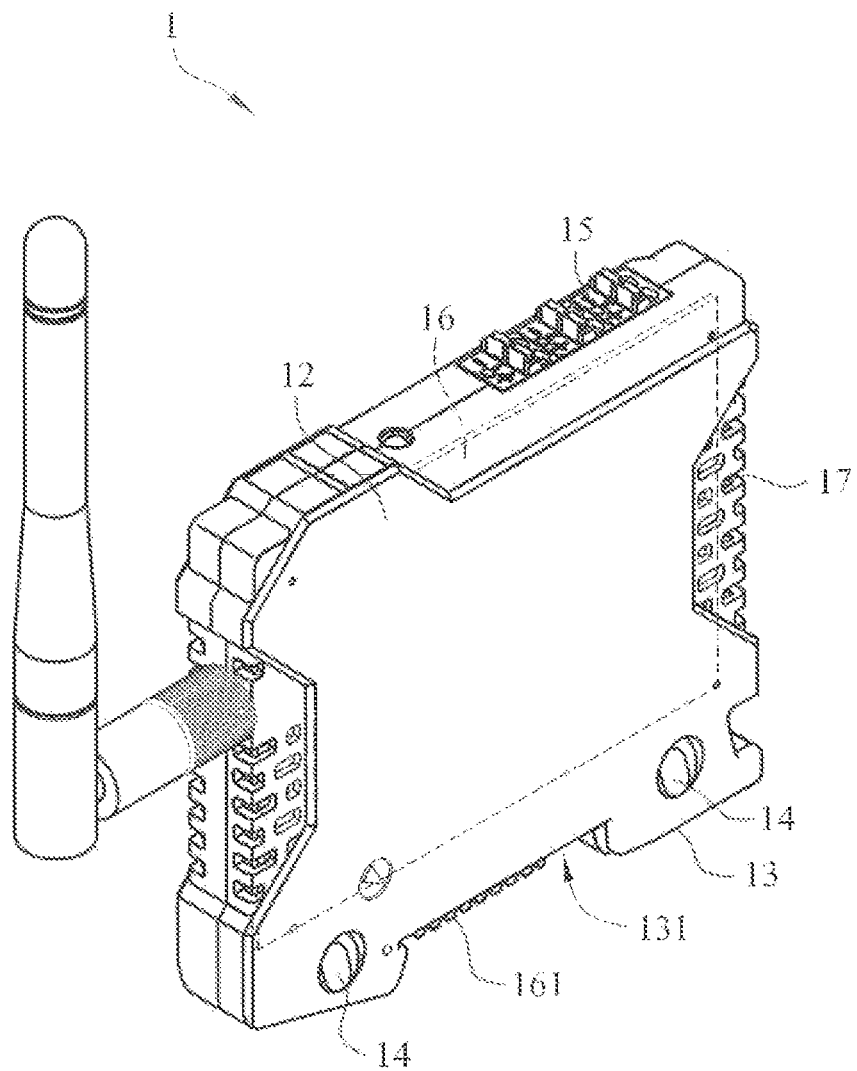
FIG. 2 is a perspective view, observed from another angle, of the first preferred specific embodiment of the present invention.

Referring to FIG. 1 and FIG. 2 together, FIG. 1 is a perspective view of a first preferred specific embodiment of the present invention, and FIG. 2 is a perspective view, observed from another angle, of the first preferred specific embodiment of the presented invention.

An electronic device enclosure 1 is shown in FIG. 1 and FIG. 2, and the electronic device enclosure 1 comprises a front surface 11, a back surface 12 opposite to the front surface 11, and a lateral edge 13 connected with the front surface 11.

Moreover, as shown in FIG. 1 and FIG. 2, a part of the front surface 11 is sloped towards the back surface 12 to define a slope area 111 that extends to the lateral edge 13.

In addition, the electronic device enclosure 1 is provided with at least one attachment 14 located in the slope area 111 and at least one connecting port 15 located away from the slope area 111.

In this embodiment, the number of the at least one attachment 14 is two, and each of the two attachments 14 is a locking hole that extends through the front surface 11 and the back surface 12 of the electronic device enclosure 1. Of courses, the number of the attachment 14 is not limited, and the attachment 14 may be a structure of other forms e.g., a hook (a snap) am adhesive member used for bonding components together, or the like.

Furthermore, the number of the at least one connecting port 15 is three in this embodiment. Of course, the number of the connecting port 15 is not limited and can be varied depending on practical using demands.

Figure 3:
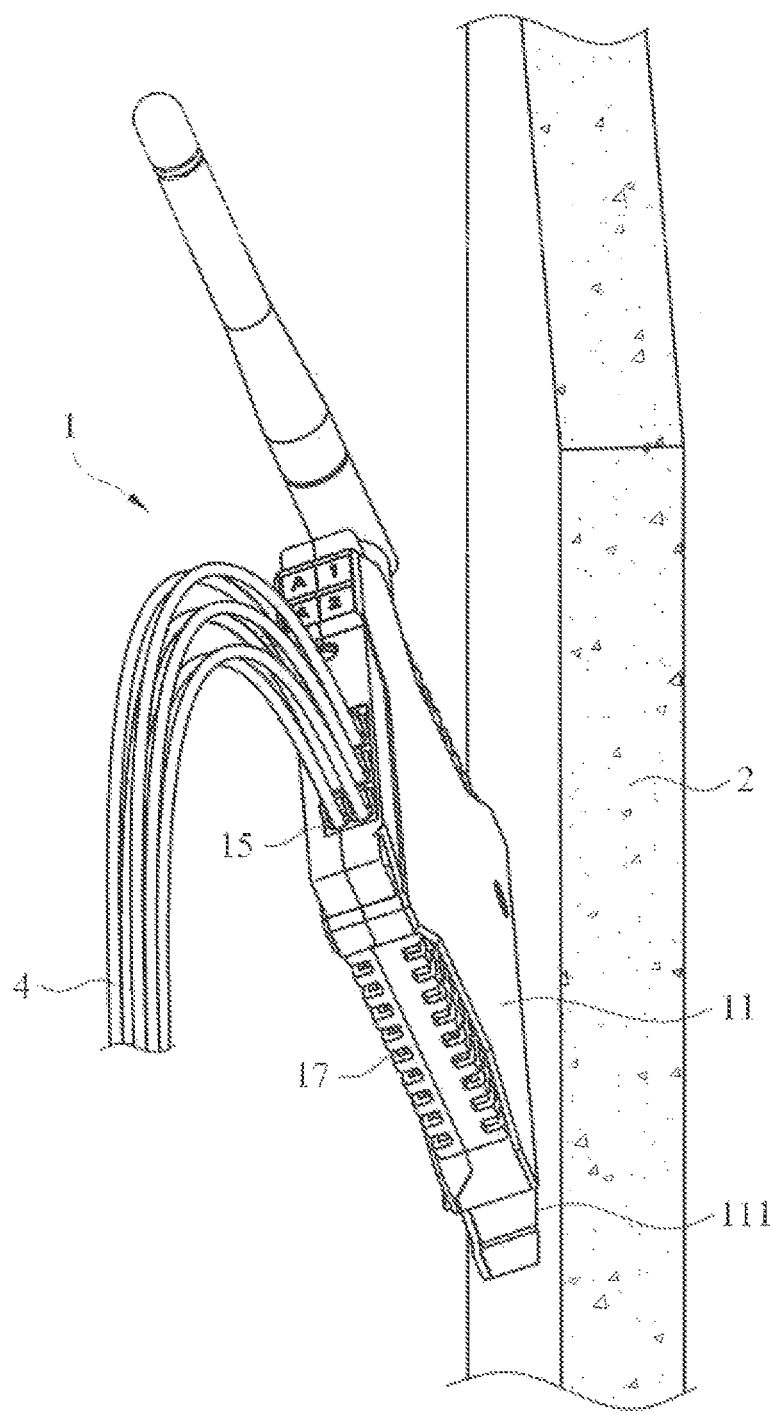
FIG. 3 is a perspective view of implementation of the first preferred specific embodiment of the present invention.
Figure 4:
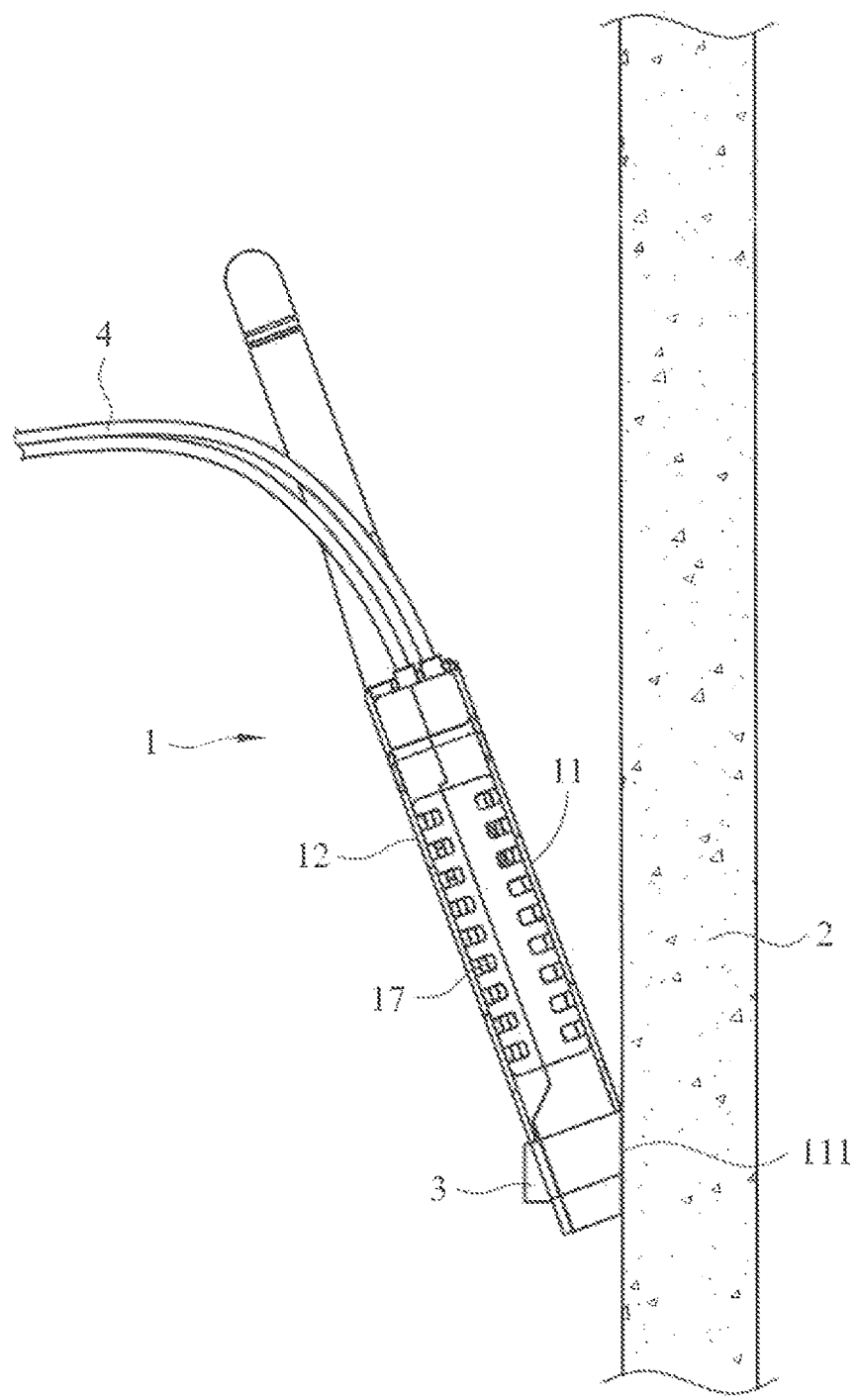
FIG. 4 is a side view of implementation of the first preferred specific embodiment of the present invention.

Referring to FIG. 3 and FIG. 4 together, FIG. 3 is a perspective view of implementation of the first preferred specific embodiment of the present invention, and FIG. 4 is a side view of implementation of the first preferred specific embodiment of the present invention. Please also refer to FIG. 1 and FIG. 2 together.

During practical use, i.e., when the aforesaid electronic device enclosure 1 is to be installed on the wall 2, two screws 3 are respectively inserted through the attachments 14, i.e., the locking holes, to have the electronic device enclosure 1 screwed on the wall 2.

Further speaking, although not show, the attachment 14 can be designed as a structure of other forms to have the electronic device enclosure 1 installed on the wall 2 as described above. For example, the attachment 14 may be a hook through which the electronic device enclosure 1 can be hung on the wall 2 via corresponding holes on the wall 2. As another example, the attachment 14 may be an adhesive member used for bonding components together so that the electronic device enclosure 1 can be adhered to corresponding adhesives members on the wall 2.

As shown in FIG. 1 to FIG. 4, after the electronic device enclosure 1 is installed on the wall 2, the electronic device enclosure 1 is sloped from the wall 2 with an angle due to the structural design that the front surface 11 thereof has a slope area 111. At this point, the connecting port 15 located away from the slope area 111 of the front surface 11 will be spaced apart from the wall 2 for a distance, so people can connected (plug) the circuit lines 4 to the connecting port 15 in a relatively large space without the limitation of the wall 2 and the using convenience can be improved remarkably.

Figure 5:
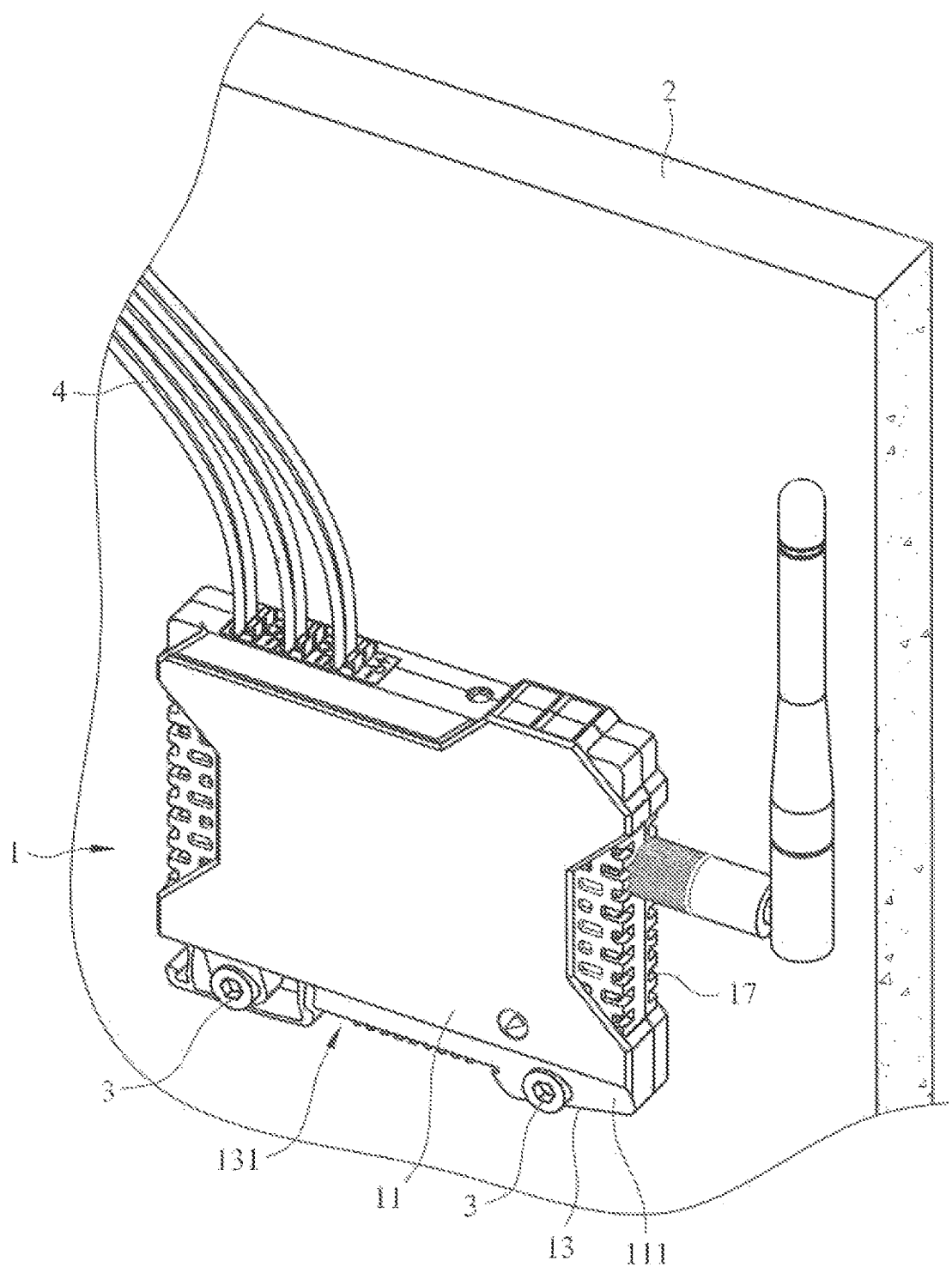
FIG. 5 is a perspective view of implementation of the second preferred specific embodiment of the present invention.
Figure 6:
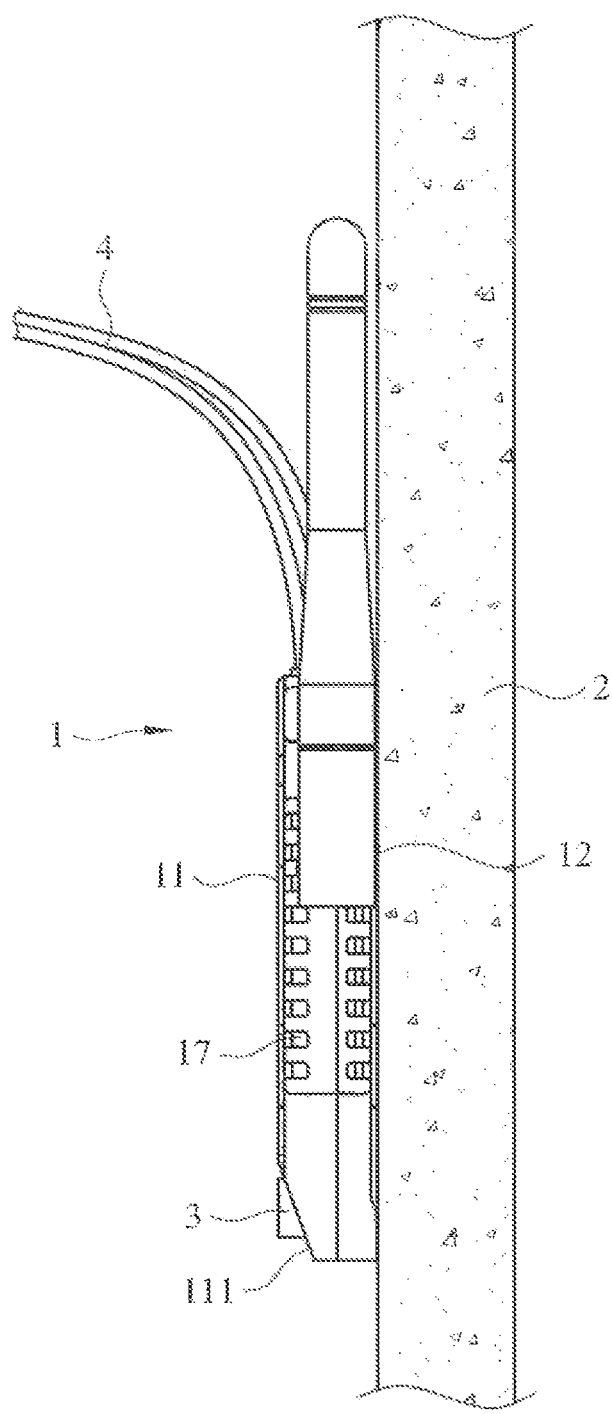
FIG. 6 is a side view of implementation of the second preferred specific embodiment of the present invention.

Referring to FIG. 5 and FIG. 6 together, FIG. 5 is a perspective view of implementation of a second preferred specific embodiment of the present invention, and FIG. 6 is a side view of implementation of the second preferred specific embodiment of the presented invention. Please also refer to FIG. 1 and FIG. 2 together.

In this embodiment, it is shown that the electronic device enclosure 1 is installed on the wall 2 with the back surface 12 thereof facing the wall 2, and the back surface 12 does not have a slope area 111 like the front surface 11, so the electronic device enclosure 1 is closely attached to the wall 2.

Figure 7:
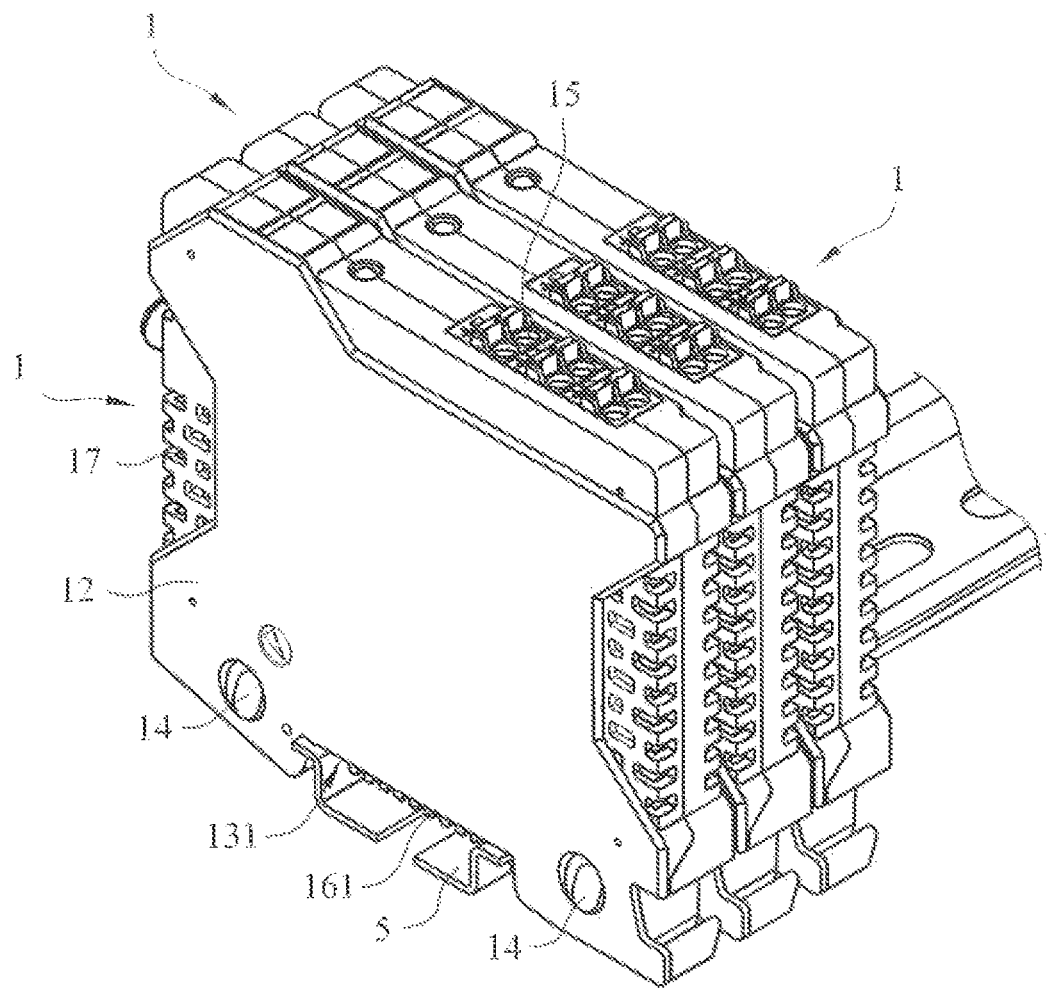
FIG. 7 is a perspective view of implementation of the third preferred specific embodiment of the present invention.

Referring to FIG. 7, FIG. 7 is a perspective view of implementation of a third preferred specific embodiment of the present invention, and please also refer to FIG. 1 and FIG. 2 together.

In this embodiment, it is shown that the lateral edge 13 of the electronic device enclosure 1 is formed with a concave portion 131. In addition, the electronic device enclosure 1 has a circuit board 16 received therein, and the circuit board 16 can be designed depending on demands for different functions.

Furthermore, in this embodiment, a connector 161 (e.g., a connector with terminal wiring function) is soldered to the circuit board 16 and protrudes from the concave portion 131. Additionally, the electronic device enclosure 1 is provided with at least one heat dissipating hole 17, and a plurality of dissipating holes 17 are shown in FIG. 7.

As shown in FIG. 7, the electronic device enclosure 1 can form a terminal block structure and be connected an disposed on a terminal rail 5 with the structural design of the concave portion 131 so as to form an electronic circuit connection (i.e., the so-called terminal bus structure).

What described above are only the preferred specific embodiments of the present invention, but are not intended to limit the present invention. Any modifications, equivalent replacements and improvements that are made within the spirit and principle of the present invention shall all be covered within the claimed scope of the present invention.

The invention claimed is:

1. An electronic device enclosure, comprising a front surface, a back surface opposite to the front surface, and a lateral edge connected with the front surface, wherein a part of the front surface is sloped towards the back surface to define a slope area that extends to the lateral edge, and the electronic device enclosure is provided with at least one attachment disposed integral with and located within the slope area and at least one connecting port located away from the slope area, whereby when the electronic device enclosure is attached to a plane with the sloped area against the plane, the connecting port is spaced from the plane for a distance.

2. The electronic device enclosure of claim 1, wherein the at least one attachment is a locking hole that extends through the front surface and the back surface.

3. The electronic device enclosure of claim 1, wherein the lateral edge is formed with a concave portion.

4. The electronic device enclosure of claim 1, wherein the electronic device enclosure has a circuit board received therein.

5. The electronic device enclosure of claim 1, wherein a connector is soldered to the circuit board and protrudes from the concave portion.

6. The electronic device enclosure of claim 1, wherein the electronic device enclosure is provided with at least one heat dissipating hole.

* * * * *